United States Patent [19]
Kelem

[11] Patent Number: 5,708,597
[45] Date of Patent: Jan. 13, 1998

[54] STRUCTURE AND METHOD FOR IMPLEMENTING A MEMORY SYSTEM HAVING A PLURALITY OF MEMORY BLOCKS

[75] Inventor: Steven H. Kelem, Los Altos Hills, Calif.

[73] Assignee: Xilinx, Inc., San Jose, Calif.

[21] Appl. No.: 752,868

[22] Filed: Nov. 20, 1996

[51] Int. Cl.[6] .................................................. G11C 13/00
[52] U.S. Cl. ........................... 365/230.03; 365/230.02; 365/189.01
[58] Field of Search ................... 365/230.02, 230.03, 365/189.01, 189.02, 230.06

[56] References Cited

U.S. PATENT DOCUMENTS 5,245,585  9/1993  Voss et al. ..................... 365/230.02
5,412,613  5/1995  Galbi et al. .................... 365/230.03

OTHER PUBLICATIONS

"XC4000™ Series Data Sheet", dated Feb. 2, 1996 available from Xilinx, Inc., 2100 Logic Drive, San Jose, CA 95124.

Mead and Conway, "Introduction to VLSI Systems", 1980, Addison–Wesley Pub. Co., pp. 292–294, ISBN 0-201-04358-0.

*Primary Examiner*—David C. Nelms
*Assistant Examiner*—Vu A. Le
*Attorney, Agent, or Firm*—E. Eric Hoffman; Jeanette S. Harms

[57] ABSTRACT

A memory system and method which allows a plurality of memory circuits to be operated independently as separate memories, or jointly as a single memory. Alternatively, the selected memory circuits are operated jointly and other memory circuits are operated independently. The configuration of the memory system can be varied dynamically during operation of the memory system.

19 Claims, 8 Drawing Sheets

STRUCTURE AND METHOD FOR IMPLEMENTING A MEMORY SYSTEM HAVING A PLURALITY OF MEMORY BLOCKS

BACKGROUND OF THE INVENTION

This invention relates to a structure and method for implementing a memory system. More specifically, the present invention relates to a memory system having a plurality of memory circuits which can be accessed separately or jointly.

DESCRIPTION OF THE PRIOR ART

Programmable logic devices (PLDs) typically consist of arrays of programmable logic blocks, programmable input/output (I/O) blocks and programmable interconnections between the logic and I/O blocks. Typical logic blocks are fixed in size and can be configured (programmed) as arrays of random access memory (RAM) or read-only memory (ROM). In a particular example, a 16×1 bit array (or bank) is formed from a logic block. Larger memory arrays, of sizes that are multiples of 16, are made by combining a plurality of logic blocks. As the memory array is made larger, additional logic blocks must be configured to perform the address decode and bank select functions. This approach is inefficient, both in terms of chip area consumed by the memory array and the signal delay associated with the memory array. In addition, the size of the memory array is fixed when the PLD is programmed. This prevents PLDs from being used in applications which require that the memory size be changed dynamically during operation of the memory array.

Some mask-programmed gate arrays provide a few (1-4) large dedicated blocks of RAM. In these gate arrays, each RAM block has separate dedicated addressing circuitry. As a result, these RAM blocks cannot be jointly addressed to create a single RAM block which includes all of the individual RAM blocks without using additional logic. Nor can these large memory blocks be decomposed into smaller blocks of memory that can be accessed simultaneously and independently. Furthermore, the memory configuration cannot be dynamically changed using these gate arrays.

It would therefore be desirable to have a memory system which allows the designer to selectively separate and/or join a plurality of memory arrays. It would also be desirable to have a memory system in which the memory arrays can be separated and joined dynamically during operation of the memory system.

SUMMARY

In accordance with one embodiment of the invention, a memory system includes a first memory circuit, a second memory circuit and a first switching logic circuit. The first switching logic circuit is connected to a first line set which receives a first plurality of memory control signals, and to a second line set which receives a second plurality of memory control signals. The memory control signals typically include data signals, read/write enable signals, memory circuit enable signals and address signals.

A third line set connects the first switching logic circuit to the first memory circuit, and a fourth line set connects the first switching logic circuit to the second memory circuit.

The first switching logic circuit is further coupled to a first control line which receives a signal which is hereinafter referred to as a SPLIT signal. When the SPLIT signal is in a first logic state, the first switching logic circuit couples the first line set to the third line set, thereby routing the first memory control signals to the first memory circuit. In this state, the SPLIT signal further causes the first switching logic circuit to couple the second line set to the fourth line set, thereby routing the second memory control signals to the second memory circuit. As a result, the first and second memory circuits are accessed independently.

When the SPLIT signal is in a second logic state, the first switching logic circuit couples the first and second memory circuits to a selected one of the first and second line sets. As a result, the first and second memory circuits are accessed jointly from the selected line set.

In the foregoing manner, the first and second memory circuits can be operated as one large memory or two smaller memories. Because the configuration is controlled by the SPLIT signal, the configuration can be dynamically modified by changing the state of the SPLIT signal during normal operation of the memory system.

The line set from which the first and second memory circuits are accessed is selected in response to a CTRL__AB signal which is received by the first switching control circuit. When the CTRL__AB signal is in a first state, the first and second memory circuits are accessed by the memory control signals on the first line set, and when the CTRL__AB signal is in a second state, the first and second memory circuits are accessed from the memory control signals on the second line set.

The memory system can further include a second switching logic circuit which routes a first output signal from the first memory circuit and a second output signal from the second memory circuit. The second switching logic circuit receives the SPLIT signal. When the SPLIT signal is in the first state, the second switching logic circuit routes the first and second output signals separately.

When the SPLIT signal is in the second state, the second switching logic circuit passes a selected one of the first and second output signals. This selection is performed in response to the CTRL__AB signal and predetermined signals on the first and second line sets. The second switching logic circuit enables the appropriate output signal to be passed when the first and second memory circuits are operated jointly.

The memory system can be modified to operate with more than two memory circuits. The memory system can be implemented using a PLD or other integrated circuits. The present invention will be more fully understood in light of the following detailed description taken together with the drawings.

DETAILED DESCRIPTION

Figure 1:
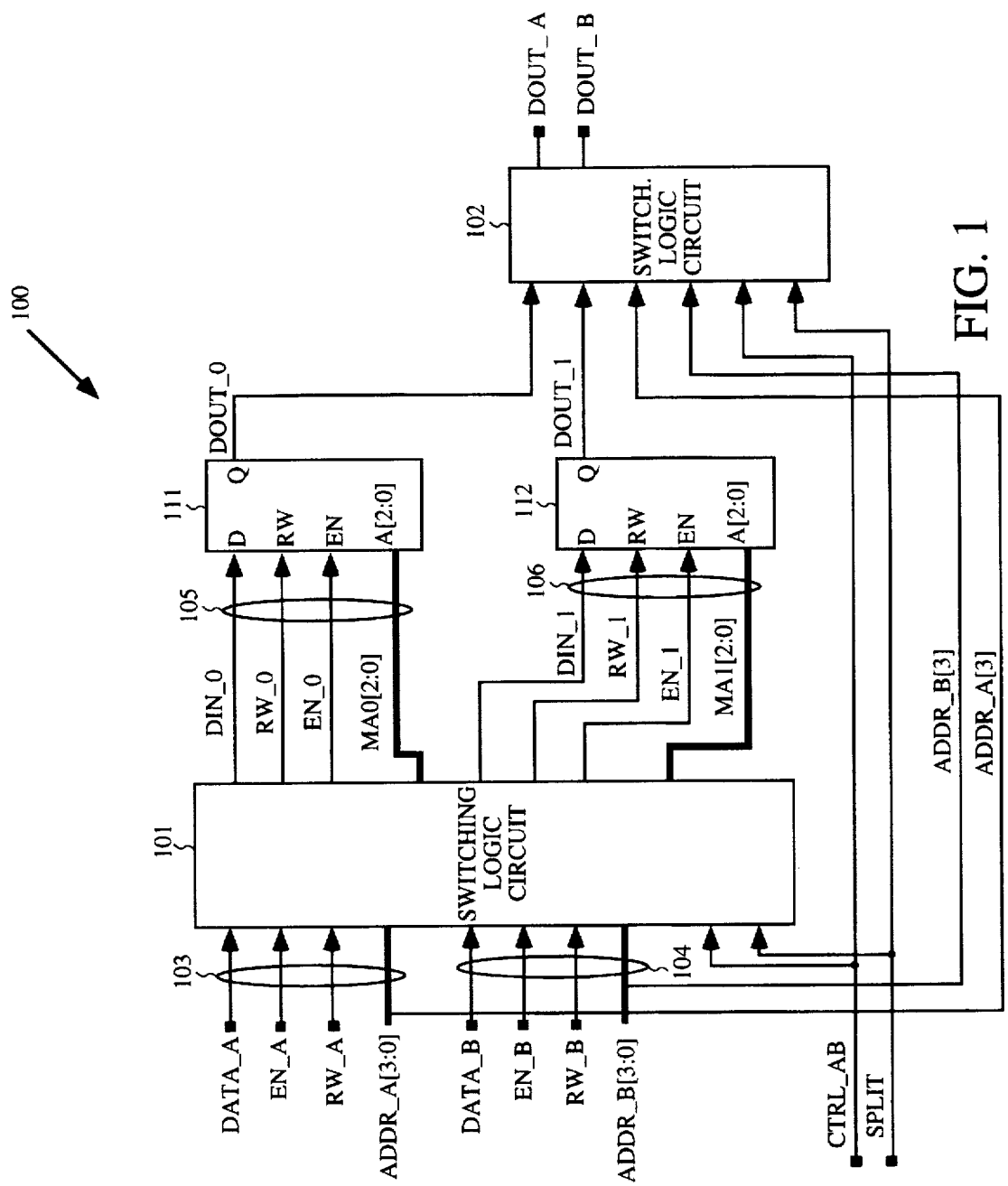
FIG. 1 is a block diagram of a memory system in accordance with one embodiment of the invention.

FIG. 1 is a diagram of a memory system 100 in accordance with one embodiment of the present invention. In this embodiment, memory system 100 is implemented to be part of a programmable logic device (PLD), such as Xilinx's XC4000™ FPGA. General information concerning the operation and interaction of various elements of the FPGA are provided in Xilinx's XC4000™ data sheet, which is hereby incorporated by reference in its entirety. In other embodiments, memory system 100 is fabricated as part of and as an integrated circuit other than an FPGA. Memory system 100 includes switching logic circuits 101 and 102 and memory circuits 111 and 112.

Switching logic circuit 101 is coupled to a first set of input control lines 103 and to a second set of input control lines 104. The first set of input control lines 103 receives a data signal DATA_A, an enable signal EN_A, a read/write signal RW_A and a first group of address signals ADDR_A[3:0] from logic forming circuitry (not shown) of the PLD. These signals are provided to switching logic circuit 101. Similarly, the second set of input control lines 104 receives a data signal DATA_B, an enable signal EN_B, a read/write signal RW_B and a second group of address signals ADDR_B[3:0] from the logic forming circuitry of the PLD. These signals are also provided to switching logic circuit 101. As described in more detail below, the signals received on first and second line sets 103 and 104 are signals which are typically used to access a memory array, and are not limited to the illustrated signals. Switching logic circuit 101 also receives a routing control signal CTRL_AB and a splitting control signal SPLIT on two additional input control lines.

In response to the previously described input signals, switching logic circuit 101 transmits a group of signals to memory circuit 111 on line set 105, and a group of signals to memory circuit 112 on line set 106. The group of signals provided to memory circuit 111 are labeled as data signal DIN_0, read/write signal RW_0, enabling signal EN_0 and address signals MA0[2:0]. The group of signals provided to memory circuit 112 are labeled as data signal DIN_1, read/write signal RW_1, enabling signal EN_1 and address signals MA1[2:0].

Memory circuits 111 and 112 are conventional memory circuits implemented on the PLD. In the embodiment illustrated, memory circuits 111 and 112 are each 8×1 bit static random access memory (SRAM) arrays. Although the present invention is described as using SRAM arrays, other types of memory circuits, such as DRAM arrays and ROM arrays, can be used in other embodiments. Moreover, other embodiments use memory arrays having different sizes. In these other embodiments, the number of address signals is modified to allow the memory arrays to be addressed properly. Memory circuit 111 performs read and write operations in response to the signals received on line set 105, and memory circuit 112 performs read and write operations in response to the signals received on line set 106.

Memory circuits 111 and 112 provide respective output signals DOUT_0 and DOUT_1 to switching logic circuit 102. Switching logic circuit 102 also receives the CTRL_AB signal, the SPLIT signal, and the most significant bits of the addresses provided to switching logic circuit 101, namely, ADDR_A[3] and ADDR_B[3]. In response, switching logic circuit 102 provides output signals DOUT_A and DOUT_B.

Switching logic circuits 101 and 102 are configurable to allow the circuit designer to select the manner in which memory system 100 is operated. The following modes of operation are available.

In a first mode, control signal SPLIT is held at the logic value to allow switching logic circuit 101 to route the signals on the first set of input control lines 103 to memory circuit 111 via line set 105 and the signals on the 2nd set of input control lines 104 to memory circuit 111 via lines set 106. Thus, in the first mode, memory circuit 111 and 112 are separately operated as an 8×1 bit memory in response to the signals on the first set of input control lines 103. Similarly, switching logic circuit 101 routes the signals on the second set of input control lines 104 to memory circuit 112 via line set 106. Thus, memory circuit 112 is separately operated as an 8×1 bit memory in response to the signals on the second set of input control lines 104. In this first mode, output signal DOUT_0 of memory circuit 111 is routed through switching logic circuit 102 as output signal DOUT_A, and the output signal DOUT_1 of memory circuit 112 is routed through switching logic circuit 102 as output signal DOUT_B. Memory circuits 111 and 112 are operated independently and separately in the first mode of operation.

In a second mode of operation, control signals SPLIT and CTRL_AB are held at the logic values to allow memory circuits 111 and 112 to be operated jointly as a 16×1 bit memory in response to the signals received on the first set of input control lines 103. In the second mode, switching logic circuit 101 dynamically routes the signals on the first line set 103 to one of memory circuits 111 and 112. As described in more detail below, the memory circuit accessed is determined by the value of the most significant address bit, ADDR_A[3]. When memory circuit 111 is accessed, output signal DOUT_0 of memory circuit 111 is routed through switching logic circuit 102 as output signals DOUT_A and DOUT_B. Similarly, when memory circuit 112 is accessed, output signal DOUT_1 of memory circuit 112 is routed through switching logic circuit 102 as output signals DOUT_A and DOUT_B. Memory circuits 111 and 112 are operated jointly as a single memory in the second mode of operation.

In a third mode, control signals SPLIT and CTRL_AB are held at the logic values to allow memory circuits 111 and 112 to be operated jointly as a 16×1 bit memory in response to the signals on the second set of input control lines 104. In the third mode, switching logic circuit 101 dynamically routes the signals on the second line set 104 to one of memory circuits 111 and 112. As described in more detail below, the memory circuit accessed is determined by the value of the most significant address bit, ADDR_B[3]. When memory circuit 111 is accessed, output signal DOUT_0 of memory circuit 111 is routed through switching logic circuit 102 as output signals DOUT_A and DOUT_B. Similarly, when memory circuit 112 is accessed, output signal DOUT_1 of memory circuit 112 is routed through switching logic circuit 102 as output signals DOUT_A and DOUT_B. Memory circuits 111 and 112 are operated jointly as a single memory in the third mode of operation.

As described in more detail below, the status of the SPLIT signal determines whether memory circuits 111 and 112 are operated separately (first mode) or jointly (second and third modes). When the SPLIT signal is in a first state (e.g., a logic "0" value), memory circuits 111 and 112 are operated jointly (i.e., in either the second or third mode). When the SPLIT signal is in a second state (e.g., a logic "1" value), memory circuits 111 and 112 are operated separately (i.e., in the first mode).

When memory circuits 111 and 112 are operated jointly, the status of the CTRL_AB signal determines whether memory circuits 111 and 112 are controlled by the signals on the first set of input control lines 103 (i.e., in the second mode) or by the signals on the second set of input control lines 104 (i.e., in the third mode). When the CTRL_AB signal is in a first state (e.g., a logic "0" value), memory circuits 111 and 112 are operated in response to the signals received on the first set of input control lines 103 (i.e., memory system 100 operates in the second mode). Conversely, when the CTRL_AB signal is in a second state (e.g., a logic "1" value), memory circuits 111 and 112 are operated in response to the signals received on the second set of input control lines 104 (i.e., memory system 100 operates in the third mode).

Switching Logic Circuit 101

Figure 2:
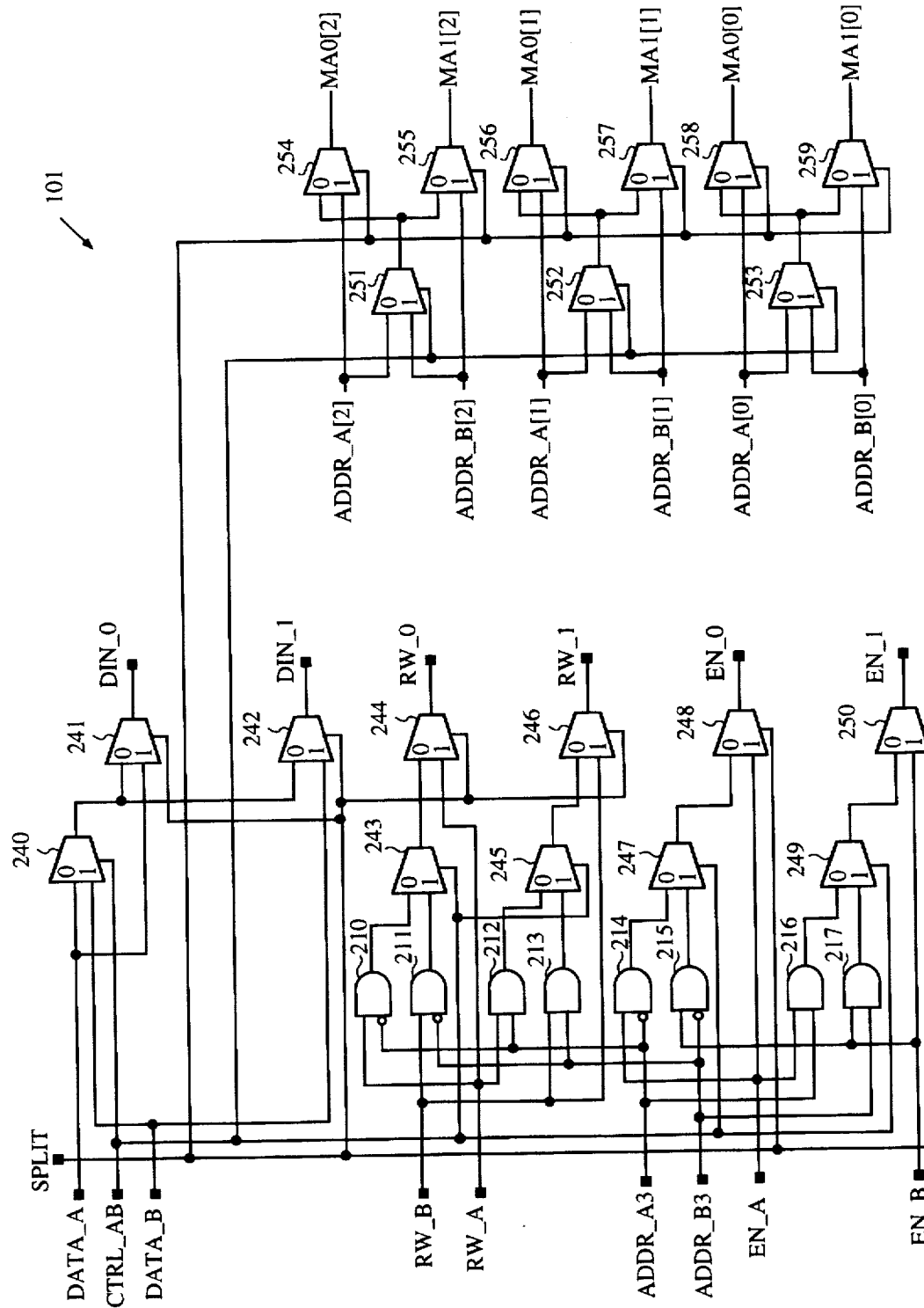
FIG. 2 is a schematic diagram of one of the switching logic circuits of FIG. 1 in accordance with one embodiment of the invention.

FIG. 2 is a schematic diagram of switching logic circuit 101 in accordance with one embodiment of the invention. In this embodiment, switching logic circuit 101 includes AND gates 210–217 and multiplexers 240–259. Multiplexers 240–259 pass signals in response to the signals applied to the control terminals of these multiplexers. For example, multiplexer 240 passes the signal applied to its "1" input terminal (i.e., the DATA_B signal) when the signal applied to its control terminal (i.e., the CTRL_AB signal) has a logic "1" value. Multiplexers 241–259 operate in a similar manner.

To enable the first mode of operation, in which memory circuits 111 and 112 are operated as separate 8×1 bit memories, the SPLIT signal is set to a logic "1" value. When the SPLIT signal has a logic "1" value, multiplexers 241 and 242 pass the DATA_A and DATA_B signals as the DIN_0 and DIN_1 signals, respectively. Similarly, multiplexers 244 and 246 pass the RW_A and RW_B signals as the RW_0 and RW_1 signals, respectively. Multiplexers 248 and 250 pass the EN_A and EN_B signals as the EN_0 and EN_1 signals, respectively.

The logic "1" SPLIT signal causes multiplexers 254, 256 and 258 to pass the ADDR_A[2:0] address signals as the MA0[2:0] address signals. The logic "1" SPLIT signal further causes multiplexers 255, 257 and 259 to pass the ADDR_B[2:0] address signals as the MA1[2:0] address signals.

Therefore, when the SPLIT signal has a logic "1" value, switching logic circuit 101 passes the signals received on the first set of input control signal lines 103 to memory circuit 111 on line set 105 (FIG. 1). Similarly, switching logic circuit 101 passes the signals received on the second set of input control lines 104 to memory circuit 112 on line set 106. As a result, memory circuit 111 is accessed by the signals received on the first set of input control signal lines 103, and memory circuit 112 is independently accessed by signals received on the second set of input control signal lines 104.

When the SPLIT signal has a logic "0" value, memory system 100 is operated in either the second mode or the third mode, depending on the status of the CTRL_AB signal. If the CTRL_AB signal has a logic "0" value, the signals provided on the first set of input control signal lines 103 are used to control both memory circuits 111 and 112 (i.e., the second mode is enabled). Under these conditions, switching logic circuit 101 operates as follows. Multiplexer 240 passes the DATA_A signal in response to the logic "0" CTRL_AB signal. Multiplexers 241 and 242 both pass the DATA_A signal received from multiplexer 240 in response to the logic "0" SPLIT signal. As a result, the DATA_A signal is provided to memory circuits 111 and 112 as the DIN_0 and DIN_1 signals, respectively.

In the second mode, the most significant bit of address signal ADDR_A[3] is used to indicate whether memory circuit 111 or memory circuit 112 is being accessed. An ADDR_A[3] signal having a logic "0" value indicates an access to memory circuit 111. Conversely, an ADDR_A[3] signal having a logic "1" value indicates an access to memory circuit 112. Thus, in the second mode, when the ADDR_A[3] signal has a logic "0" value, AND gate 210 and multiplexers 243 and 244 pass the RW_A signal as the RW_0 signal. AND gate 212 and multiplexers 245 and 246 pass a logic "0" value as the RW_1 signal. Similarly, AND gate 214 and multiplexers 247 and 248 pass the EN_A signal as the EN_0 signal. AND gate 216 and multiplexers 249 and 250 pass a logic "0" value as the EN_1 signal. Thus, switching logic circuit 101 routes the EN_A and RW_A signals received on the first set of input control lines 103 to memory circuit 111 on line set 105. Because memory circuit 112 receives EN_1 and RW_1 signals having logic "0" values, memory circuit 112 remains inactive.

If, in the second mode, the ADDR_A[3] signal has a logic "1" value, AND gate 212 and multiplexers 245 and 246 pass the RW_A signal as the RW_1 signal. AND gate 210 and multiplexers 243 and 244 pass a logic "0" value as the RW_0 signal. Similarly, AND gate 216 and multiplexers 249 and 250 pass the EN_A signal as the EN_1 signal. AND gate 214 and multiplexers 247 and 249 pass a logic "0" value as the EN_0 signal. Thus, switching logic circuit 101 routes the EN_A and RW_A signals received on the first set of input control lines 103 to memory circuit 112 on line set 106. Because memory circuit 111 receives EN_0 and RW_0 signals having logic "0" values, memory circuit 111 remains inactive.

Furthermore, when the SPLIT and CTRL_AB signals are both logic "0" values (i.e., in the second mode of operation), switching logic circuit 101 passes address signals ADDR_A[2:0] through multiplexers 251–259 such that address signals MA0[2:0] are set equal to address signals ADDR_A[2:0], and address signals MA1[2:0] are also set equal to address signals ADDR_A[2:0]. That is, the address signals ADDR_A[2:0] received by switching logic circuit 101 are provided to both memory circuit 111 and memory circuit 112.

When the SPLIT signal has a logic "0" value and the CTRL_AB signal has a logic "1" value, the third mode of operation is selected. That is, memory circuits 111 and 112 are operated jointly in response to the signals received on the second set of input control lines 104. Multiplexers 240–242 pass the DATA_B signal to memory circuits 111 and 112 as the DIN_0 and DIN_1 signals in response to the logic "0" SPLIT signal and the logic "1" CTRL_AB signal.

In the third mode, the most significant bit of address signal ADDR_B[3] is used to indicate whether memory circuit 111 or memory circuit 112 is being accessed. Address signal ADDR_B[3] accomplishes this function in a manner similar to that previously described for address signal ADDR_A[3] in the second mode.

Furthermore, in the third mode of operation, switching logic circuit 101 passes address signals ADDR_B[2:0] through multiplexers 251–259 such that address signals MA0[2:0] are set equal to address signals ADDR_B[2:0], and address signals MA1[2:0] are also set equal to address signals ADDR_B[2:0]. That is, the address signals ADDR_B[2:0] received by switching logic circuit 101 are provided to both memory circuit 111 and memory circuit 112.

Although switching logic circuit 101 has been described in connection with a particular circuit, other equivalent logic circuits can be used to implement the previously described functions of switching logic circuit 101. For example, logic gates 210–217 and/or multiplexers 240–259 can be replaced by pass transistors in a manner known to one of ordinary skill. Pass transistors can be used to allow time-critical signals to pass quickly through switching logic circuit 101. The following equations define switching logic circuit 101. In these equations, the term mux(s,x,y) is defined logically as ('AND x) OR (s AND y). The prime symbol (/) indicates the inverse of the marked value.

DIN_A=mux(SPLIT, mux(CTRL_AB, DATA_A, DATA_B), DATA_A)

DIN_B=mux(SPLIT, mux(CTRL_AB, DATA_A, DATA_B), DATA_B)

RW_0=mux(SPLIT, mux(CTRL_AB, RW_A AND ADDR_A[3]', RW_B AND ADDR_B[3]'), RW_A)

RW_1=mux(SPLIT, mux(CTRL_AB, RW_A AND ADDR_A[3]', RW_B AND ADDR_B[3]'), RW_B)

EN_0=mux (SPLIT, mux(CTRL_AB, EN_A AND ADDR_A[3]', EN_B AND ADDR_B[3]'), EN_A)

EN_1=Mux (SPLIT, mux(CTRL_AB, EN_A AND ADDR_A[3]', EN_B AND ADDR_B[3]'), EN_B)

For [i] in the range of 0 to n−1 (n=3)

MA0[i]=mux (SPLIT, mux(CTRL_AB, ADDR_A[i], ADDR_B[i]), ADDR_A[i]) ((SPLIT OR CTRL_AB') AND ADDR_A[i] OR (SPLIT' AND CTRL_AB AND ADDR_B[i])

MA1[i]=mux (SPLIT, mux(CTRL_AB, ADDR_A[i], ADDR_B[i]), ADDR_B[i]) (SPLIT/ OR CTRL_AB') AND ADDR_A[i] OR (SPLIT/ AND CTRL_AB AND ADDR_B[i])

Memory Circuits 111 and 112

Memory circuits 111 and 112 are conventional random access memory circuits which are known to those having ordinary skill in the art. In one embodiment, memory system 100, including memory circuits 111 and 112, is fabricated on a single integrated circuit chip. In another embodiment, memory circuits 111 and 112 are separate integrated circuits.

In the described embodiment, memory circuits 111 and 112 are 8×1 bit memory circuits. However, in another embodiment, memory circuits 111 and 112 include as few as one RAM cell each (with each RAM cell having any number of transistors). In yet another embodiment, memory circuits 111 and 112 are complex memories having capacities of kilo-, mega, giga- or tera-bits of data. Memory circuits 111 and 112 can also have data buses with widths greater than 1 bit. For example, each of memory circuits 111 and 112 could each have 8-bit data buses.

Regardless of the implementation technology, memory circuits 111 and 112, include the following ports. An address port (A) receives an address signal (e.g., A[2:0]) which indicates the location in the memory circuit is to be read or written. A read/write port (RW) receives a signal which indicates whether a read or write operation is to be performed. In a variation, separate read and write ports receive separate signals to perform this function. A data input port (D) receives data values which are to be written to the memory circuit. A data output port (Q) receives data values which are read from the memory circuit. In particular embodiments, the data input port and the data output port are combined to form a single port. An optional enable port (EN) is also provided. The enable port receives an enable signal which must be asserted for the memory circuit to be accessed.

Memory circuits 111 and 112 operate as follows. If there is an enable port, the signal provided to the enable port (e.g., EN_0) determines whether the memory circuit (e.g., memory circuit 111) is in use. If the memory circuit is not in use, applying values to the other input ports of the memory circuit has no effect on the memory circuit. All other operations listed below occur when the memory circuit is enabled. A memory circuit without an enable port is always enabled.

When the signal applied to the read/write port (RW) indicates a read operation, the data value in the memory location specified by the signals applied to the address port (A) is provided to the data output port (Q). When the signal applied to the read/write port (RW) indicates a write operation, the data value provided at the data input port (D) is written to the memory location specified by the signals applied to the address port (A).

Switching Logic Circuit 102

Figure 3:
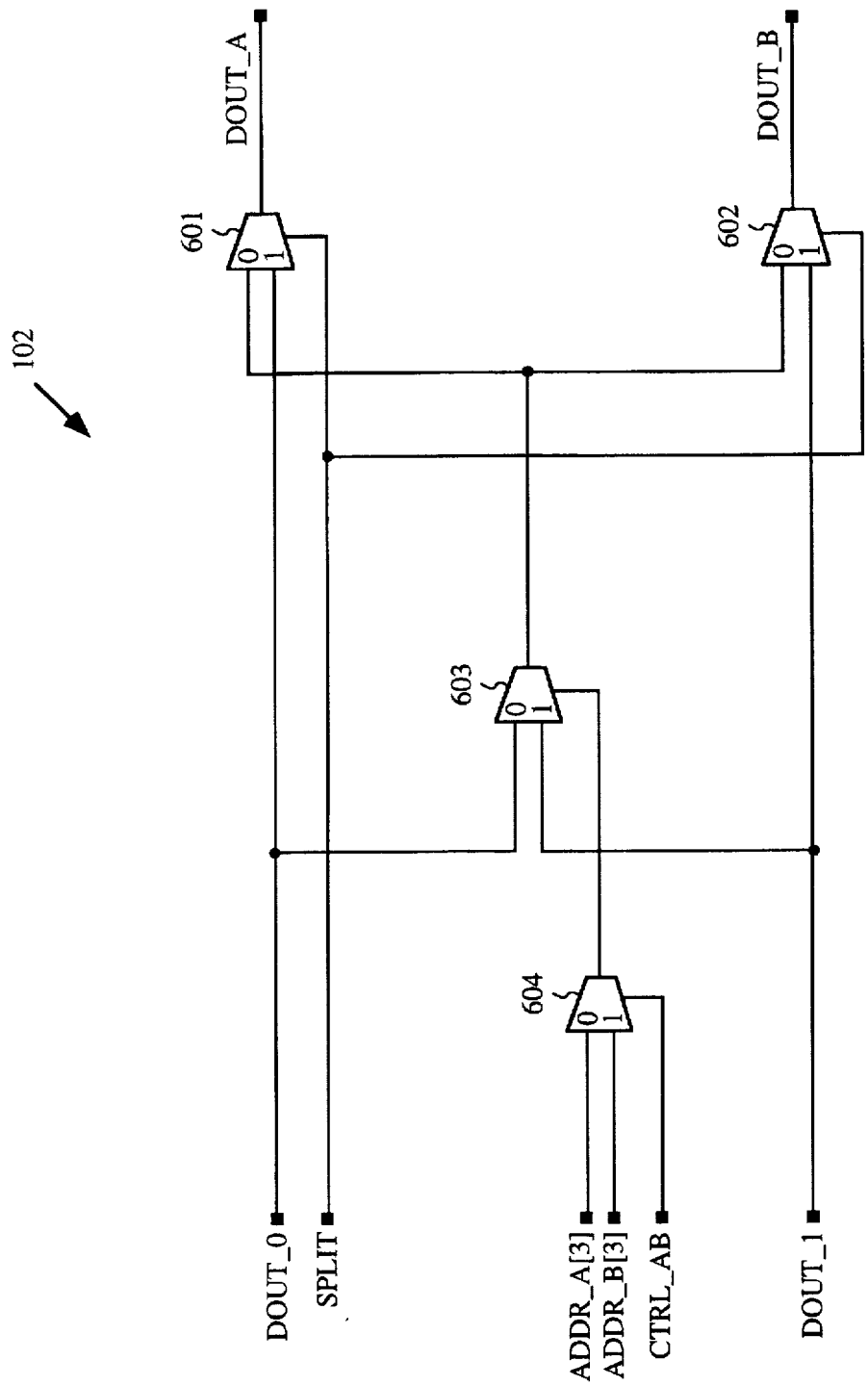
FIG. 3 is a schematic diagram of another switching logic circuit of FIG. 1 in accordance with one embodiment of the invention.

FIG. 3 is a schematic diagram of switching logic circuit 102, which includes multiplexers 601–604. In general, switching logic circuit 102 routes the DOUT_0 and DOUT_1 signals to create output signals DOUT_A and DOUT_B, in a manner which is dependent on the values of the SPLIT, CTRL_AB, ADDR_A[3] and ADDR_B[3] signals.

More specifically, the SPLIT signal is provided to the control terminals of multiplexers 601 and 602. If the SPLIT signal has a logic "1" value (i.e., memory system is operated in the first mode in which memory circuits 111 and 112 are operated separately), the DOUT_0 signal from memory circuit 111 is passed through multiplexer 601 as the DOUT_A signal, and the DOUT_1 signal from memory circuit 112 is passed through multiplexer 602 as the DOUT_B signal. Consequently, the output signals DOUT_0 and DOUT_1 are separately and independently provided as output signals of memory system 100.

If the SPLIT signal has a logic "0" value, memory circuits 111 and 112 are operated jointly in either the second or third mode. In the second and third modes, the DOUT_0 and DOUT_1 signals are routed through switching logic circuit 102 in response to the CTRL_AB, ADDR_A[3] and ADDR_B[3] signals. When the CTRL_AB signal has a logic "0" value (i.e., in the second mode), the ADDR_A[3] signal is routed through multiplexer 604 to the control terminal of multiplexer 603.

If the ADDR_A[3] signal has a logic "0" value, the DOUT_0 signal from memory circuit 111 is routed through multiplexer 603 to the "0" input terminals of multiplexers 601 and 601. Because the SPLIT signal has a logic "0" value, the DOUT_0 signal is routed through multiplexers 601 and 602 as the data output signals DOUT_A and DOUT_B, respectively.

If the ADDR_A[3] signal has a logic "1" value, the DOUT_1 signal from memory circuit 112 is routed through multiplexer 603 to the "0" input terminals of multiplexers 601 and 602. Because the SPLIT signal has a logic "0" value, the DOUT_1 signal is routed through multiplexers 601 and 602 as the data output signals DOUT_A and DOUT_B, respectively. Thus, in the second mode, data output signals DOUT_A and DOUT_B are identical.

In the third mode (i.e., the SPLIT signal has a logic "0" value and the CTRL_AB signal has a logic "1" value), the ADDR_B[3] signal controls the routing of the DOUT_0 and DOUT_1 signals in a manner similar to the manner in which the ADDR_A[3] signal controls the routing of the DOUT_0 and DOUT_1 signals in the second mode.

Although switching logic circuit 102 has been described in connection with a particular circuit, other equivalent logic circuits can be used to implement the previously described functions of switching logic circuit 102. For example, logic gates and/or pass transistors can be used in a manner known to one of ordinary skill to route the DOUT_0 and DOUT_1 signals as previously described. Pass transistors are typically used to allow time-critical signals to pass quickly through switching logic circuit 102. Switching logic circuit 102 is described by the following equations. In these equations, mux(s,x,y) is defined as (' AND x) OR (s AND y).

DOUT_A=mux(SPLIT, mux(mux(CTRL_AB, ADDR_A[3], ADDR_B[3]), DOUT_0, DOUT_1), DOUT_0)

DOUT_B=mux(SPLIT, mux(mux(CTRL_AB, ADDR_A[3], ADDR_B[3], DOUT_0, DOUT_1), DOUT_1)

Other Embodiments

In an alternative embodiment, one or both of the SPLIT and CTRL_AB signals are eliminated and replaced, using conventional logic simplification means. Logic simplification allows the use of the same basic logic previously described to be used when fabricating memory system 100 in a semiconductor substrate. However, the logic circuitry used to create the switching logic circuits are eliminated and replaced with jumpers in conductive layers formed over the substrate. In an integrated circuit, only a small number of the total number of masks would have to be modified to fabricate different integrated circuits. In this embodiment, the configuration of memory system 100 is hard-wired at the time that the integrated circuit is completed.

In an alternative embodiment, each of the SPLIT and CTRL_AB signals is generated by a corresponding configurable bit latch or another storage element which is programmed during the initialization of the PLD. In a variation of this embodiment, both the SPLIT and CTRL_AB signals are generated by a plurality of redundant configurable bit latches, with each configurable bit latch being physically located near the position at which the signal is required. This redundancy reduces wiring congestion within memory system 100. In another variation, each of the logic gates whose inputs are derived from the SPLIT and CTRL_AB signals are replaced by a storage element whose stored value is equal to the value that would have been computed by the corresponding logic gate.

In another embodiment, the SPLIT and CTRL_AB signals are generated by other logic circuitry on the PLD (not shown). In such an embodiment, the SPLIT and CTRL_AB signals are generated dynamically, such that the operating mode of memory system 100 can be changed dynamically during normal operation.

In another variation, the CTRL_AB signal is eliminated. In such a variation, memory system 100 is modified such that there is only one joint mode of operation. That is, when memory circuits 111 and 112 are to be operated jointly as a single memory, a predetermined one of the two sets of input control lines 103 or 104 is selected to control both of memory circuits 111 and 112. Thus, CTRL_AB signal is effectively predetermined to be either a logic high or a logic low value.

Figure 4:
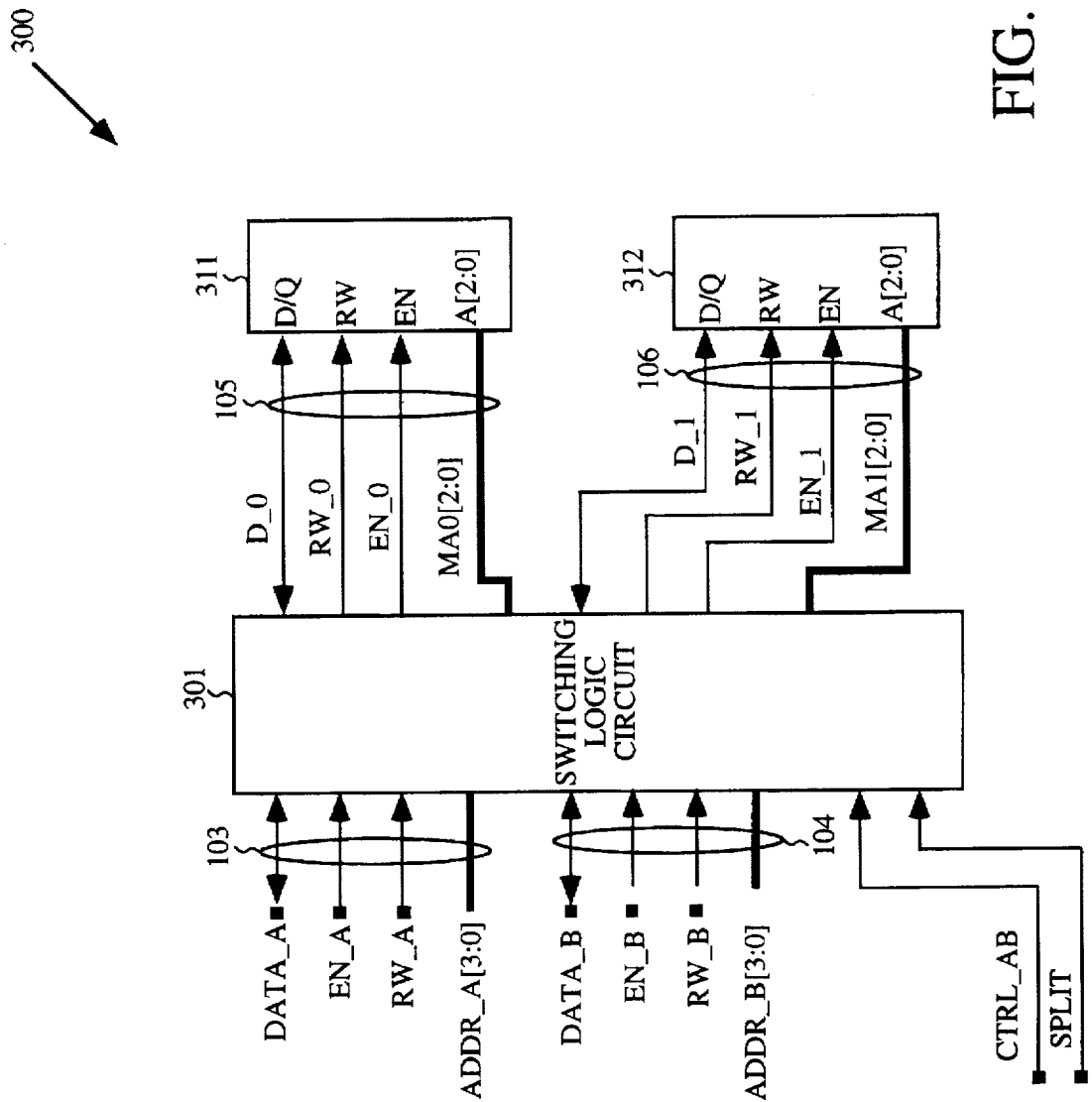
FIG. 4 is a block diagram of a memory system in accordance with another embodiment of the invention.

In yet another variation, the D and Q ports of memory circuits 111 and 112 are replaced with a single port which is a data input port when the signal applied to the read/write port (RW) indicates a read operation, and a data output port when the signal applied to the read/write port (RW) indicates a write operation. FIG. 4 is a block diagram illustrating a memory system 300 in accordance with this variation. Because memory system 300 includes many of the same elements as memory system 100, similar elements are labeled with similar reference numbers. Memory system 300 includes switching logic circuit 301. Memory system 300 also includes memory circuits 311 and 312, each of which has a single data port labeled D/Q. Data values D_0 and D_1 pass bi-directionally from the D/Q ports of memory circuits 311 and 312, respectively.

Figure 5:
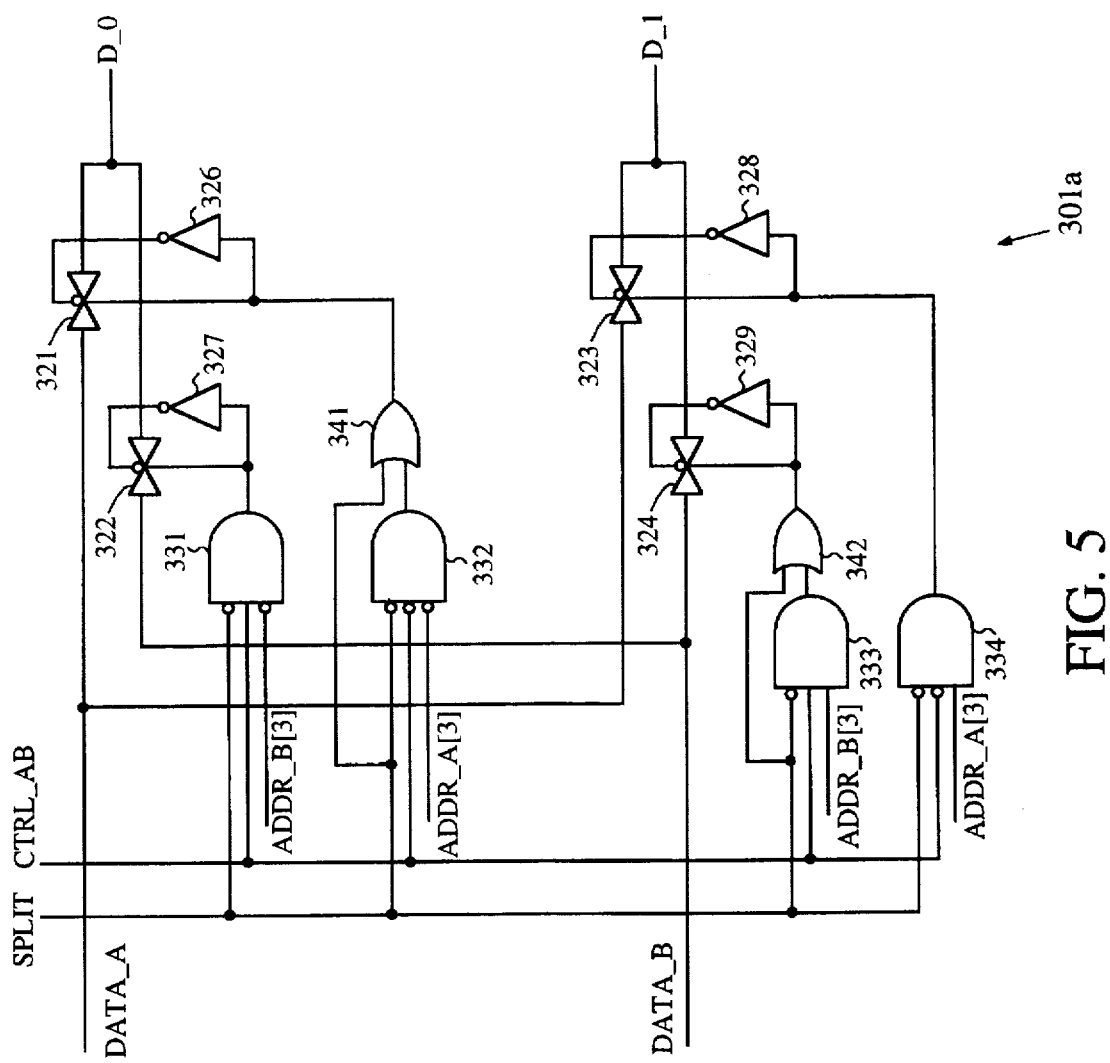
FIG. 5 is a schematic diagram of a switching logic circuit used in the memory system of FIG. 4.

FIG. 5 is a schematic diagram of a portion 301a of switching logic circuit 301. Switching logic circuit 301 is substantially identical to switching logic circuit 101 (FIG. 2). Portion 301a replaces multiplexers 240, 241 and 242 of switching logic circuit 101, thereby allowing data signals to pass bi-directionally through switching logic circuit 301. Portion 301a includes transmission gates 321–324, inverters 326–329, AND gates 331–334 and OR gates 341–342. Transmission gates 321–324 are conventional elements formed by parallel connected n-channel and p-channel pass transistors. When transmission gates 321–324 are turned on, signals can pass through these gates in either direction.

When the SPLIT signal has a logic "1" value, transmission gates 321 and 324 are turned on, and transmission gates 322 and 323 are turned off, thereby routing the DATA_A signal as the D_0 signal (and vice versa) and routing the DATA_B signal as the D_1 signal (and vice versa).

When the SPLIT signal has a logic "0" value, the data signals are routed according to the values of the CTRL_AB signal, the ADDR_A[3] signal and the ADDR_B[3] signal. When the CTRL_AB signal has a logic "0" value, transmission gates 322 and 324 are turned off, and transmission gates 321 and 323 are controlled by the ADDR_A[3] signal. An ADDR_A[3] signal having a logic "0" value causes transmission gate 321 to turn on and causes transmission gate 323 to turn off, thereby routing the DATA_A signal as the D_0 signal (and vice versa). Conversely, an ADDR_A[3] signal having a logic "1" value causes transmission gate 321 to turn off and causes transmission gate 323 to turn on, thereby routing the DATA_A signal as the D_1 signal (and vice versa).

When the SPLIT signal has a logic "0" value and the CTRL_AB signal has a logic "1" value, transmission gates 321 and 323 are turned off, and transmission gates 322 and 324 are controlled by the ADDR_B[3] signal. An ADDR_B[3] signal having a logic "0" value causes transmission gate 322 to turn on and causes transmission gate 324 to turn off, thereby routing the DATA_B signal as the D_0 signal (and vice versa). Conversely, an ADDR_B[3] signal having a logic "1" value causes transmission gate 322 to turn off and causes transmission gate 324 to turn on, thereby routing the DATA_B signal as the D_1 signal (and vice versa).

Figure 6:
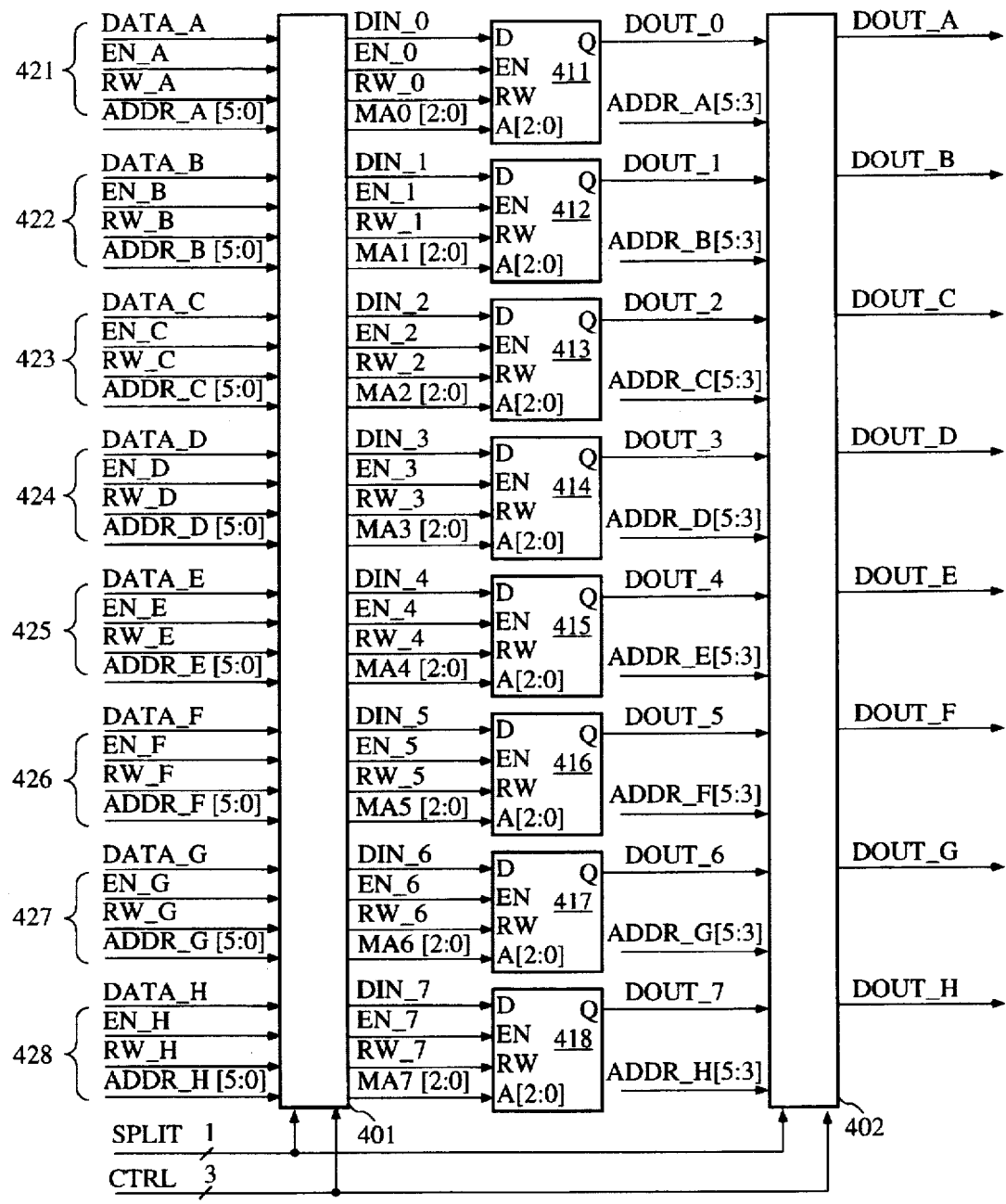
FIG. 6 is a block diagram of a memory system in accordance with another embodiment of the invention.

FIG. 6 is a block diagram of a memory system 400 in accordance with another embodiment of the invention. Memory system 400 includes switching logic circuit 401, switching logic circuit 402 and memory circuits 411–418. In the embodiment illustrated, each of memory circuits 411–418 is an 8×1 bit memory array. Other memory sizes are possible. Switching logic circuit 401 is connected to 8 sets of address, read/write, enable and data lines 421–428. Each line set 421–428 corresponds to one of memory circuits 411–418. Switching logic circuit 401 also receives a 1-bit SPLIT signal. When the SPLIT signal is asserted, switching logic circuit 401 passes the signals applied to line sets 421–428 to memory circuits 411–418 as defined logically in Table 1.

TABLE 1

| DIN_0 | = DATA_A | DIN_4 | = DATA_E |
| EN_0 | = EN_A | EN_4 | = EN_E |
| RW_0 | = RW_A | RW_4 | = RW_E |
| MA0[2:0] | = ADDR_A[2:0] | MA4[2:0] | = ADDR_E[2:0] |

TABLE 1-continued

| | | | |
|---|---|---|---|
| DIN_1 | = DATA_B | DIN_5 | = DATA_F |
| EN_1 | = EN_B | EN_5 | = EN_F |
| RW_1 | = RW_B | RW_5 | = RW_F |
| MA1[2:0] | = ADDR_B[2:0] | MA5[2:0] | = ADDR_F[2:0] |
| DIN_2 | = DATA_C | DIN_6 | = DATA_G |
| EN_2 | = EN_C | EN_6 | = EN_G |
| RW_2 | = RW_C | RW_6 | = RW_G |
| MA2[2:0] | = ADDR_C[2:0] | MA6[2:0] | = ADDR_G[2:0] |
| DIN_3 | = DATA_D | DIN_7 | = DATA_H |
| EN_3 | = EN_D | EN_7 | = EN_H |
| RW_3 | = RW_D | RW_7 | = RW_H |
| MA3[2:0] | = ADDR_D[2:0] | MA7[2:0] | = ADDR_H[2:0] |

Switching logic circuit 402 is coupled to receive the data output signals DOUT_0–DOUT_7 from memory circuits 411–418. Switching logic circuit 402 also receives the 1-bit SPLIT signal. When the SPLIT signal is asserted, switching logic circuit 402 passes the data output signals DOUT_0–DOUT_7 as defined in Table 2.

TABLE 2

| |
|---|
| DOUT_A = DOUT_0 |
| DOUT_B = DOUT_1 |
| DOUT_C = DOUT_2 |
| DOUT_D = DOUT_3 |
| DOUT_E = DOUT_4 |
| DOUT_F = DOUT_5 |
| DOUT_G = DOUT_6 |
| DOUT_H = DOUT_7 |

Therefore, when the SPLIT signal is asserted, each of memory circuits 411–418 is independently controlled by signals received on a corresponding line set 421–428.

Switching logic circuit 401 further receives a 3-bit CTRL signal. The 3-bit CTRL signal is encoded to select one of line sets 421–428 to control memory circuits 411–418 when the SPLIT signal is not asserted. Table 3 defines the CTRL signal encoding in accordance with one embodiment.

TABLE 3

| CTRL | Controlling Line Set |
|---|---|
| 000 | 421 |
| 001 | 422 |
| 010 | 423 |
| 011 | 424 |
| 100 | 425 |
| 101 | 426 |
| 110 | 427 |
| 111 | 428 |

Thus, a CTRL signal having a "000" value causes memory circuits 411–418 to be controlled by the signals provided on line set 421. In this example, switching logic circuit 401 routes the DATA_A signal from line set 421 to each of memory circuits 411–418 as the DIN_0–DIN_7 signals. Switching logic circuit 401 also routes the RW_A signal from line set 421 to each of memory circuits 411–418 as the RW_0–RW_7 signals. Switching logic circuit 401 further routes the ADDR_A[2:0] signals to each of memory circuits 411–418 as the MA0[2:0]–MA7[2:0] address signals.

The 3 most significant bits ADDR_0[5:3] of the address signal on line set 421 are encoded to determine which one of memory circuits 411–418 will receive the EN_A signal applied to line set 411 (i.e., which memory circuit 411–418 is to be accessed). Table 4 defines how switching logic circuit 401 routes the EN_A signal in response to the ADDR_A[5:3] signals in accordance with one embodiment. The memory circuits which are not selected to receive the EN_A signal are provided with an enable signal equal to a logic "0" value.

TABLE 4

| ADDR_A[5:3] | EN_A is routed as: |
|---|---|
| 000 | EN_0 |
| 001 | EN_1 |
| 010 | EN_2 |
| 011 | EN_3 |
| 100 | EN_4 |
| 101 | EN_5 |
| 110 | EN_6 |
| 111 | EN_7 |

Switching logic circuit 402 also receives the 3-bit CTRL signal. Switching logic circuit 402 also receives the 3 most significant bits ADDR_A[5:3]–ADDR_H[5:3] of each of the address signals received on line sets 421–428. The 3-bit CTRL signal is encoded to determine which of the address signals ADDR_A[5:3]–ADDR_H[5:3] is used to control the routing within switching logic circuit 402 when the SPLIT signal is not asserted. Table 5 defines the CTRL signal encoding in accordance with the described example.

TABLE 5

| CTRL | Controlling Address Signals |
|---|---|
| 000 | ADDR_A[5:3] |
| 001 | ADDR_B[5:3] |
| 010 | ADDR_C[5:3] |
| 011 | ADDR_D[5:3] |
| 100 | ADDR_E[5:3] |
| 101 | ADDR_F[5:3] |
| 110 | ADDR_G[5:3] |
| 111 | ADDR_H[5:3] |

Continuing the current example, if the CTRL signal has a "000" value, the ADDR_A[5:3] signal controls the routing of the output signals DOUT_0–DOUT_7 through switching logic circuit 402. Table 6 defines how switching logic circuit 402 routes the DOUT_0–DOUT_7 signals in response to the ADDR_A[5:3] signals.

TABLE 6

| ADDR_A[5:3] | DOUT_A–DOUT_H are set equal to: |
|---|---|
| 000 | DOUT_0 |
| 001 | DOUT_1 |
| 010 | DOUT_2 |
| 011 | DOUT_3 |
| 100 | DOUT_4 |
| 101 | DOUT_5 |
| 110 | DOUT_6 |
| 111 | DOUT_7 |

Therefore, when the SPLIT signal is not asserted, memory circuits 411–418 are jointly controlled by signals received on one of line sets 421–428. The CTRL signal determines which one of line sets 421–428 is used to access memory circuits 411–418.

The present example can be modified to accommodate other memory sizes. For example, assume that the number of addresses within each memory circuit is $2^n$, and that the number of memory circuits is $2^m$. (In the previously described example, n=3 and m=3.) The number of line sets is equal to $2^m$. The CTRL signal includes m encoded signals to select which line set controls the memory circuits when the SPLIT signal is not asserted. Address signals ADDR_i[n−1:0] are used to define the address locations within each memory circuit (where i ranges from 0 to $2^m$−1). Address signals ADDR_i[n+m−1:n] are used to control signal routing within switching logic circuits 401 and 402 when the SPLIT signal is not asserted.

In a variation of the present example, the CTRL signal is modified to be an 8-bit signal which performs the same function as the 3-bit CTRL signal. In this variation, the CTRL signal need not be encoded as previously described. Rather, each bit of the CTRL signal is dedicated to enabling a separate one of line sets 421–428.

In the embodiment where an 8-bit CTRL signal is used, the SPLIT signal can alternatively be made a 7-bit signal. More generally, the SPLIT signal has $2^m$−2 bits. Each bit of the SPLIT signal is used to determine whether a pair of adjacent memory circuits is to be operated jointly or separately. For example, the most significant bit, SPLIT[6] of the SPLIT signal can be given a logic "0" value to indicate that memory circuits 414 and 415 should be operated jointly. Conversely, the SPLIT[6] bit can be given a logic "1" value to indicate that memory circuits 414 and 415 should be operated separately. If the SPLIT[6] bit indicates that memory circuits 414 and 415 are to be operated separately (and all of the other SPLIT bits indicate joint operation), circuits 411–418 are split into two blocks of contiguous memory, with one memory block including memory circuits 411–414 and the other memory block including memory circuits 415–418. The 8-bit CTRL signal assigns one of line sets 421–424 to control memory circuits 411–414, and one of line sets 425–428 to control memory circuits 415–418. Table 7 defines the adjacent memory circuits which are joined or separated by the various bits of the SPLIT signal in one embodiment.

TABLE 7

| SPLIT BIT | JOINS OR SEPARATES THE FOLLOWING MEMORY CIRCUITS: |
|---|---|
| SPLIT [6] | 414, 415 |
| SPLIT [5] | 412, 413 |
| SPLIT [4] | 416, 417 |
| SPLIT [3] | 411, 412 |
| SPLIT [2] | 413, 414 |
| SPLIT [1] | 415, 416 |
| SPLIT [0] | 417, 418 |

By allowing adjacent memory circuits 411–418 to be selectively joined or separated, memory system 400 can be arranged in numerous configurations.

The topological arrangement of a memory system in accordance with one embodiment of the invention is illustrated in FIG. 6. In this embodiment, memory system 400 is laid out as a linear array with respect to a surface of a semiconductor substrate, with memory circuits 411–418 laid out in a linear manner and the switching logic circuits 401 and 402 laid out along side of memory circuits 411–418.

FIGS. 7a, 7b, 7c and 7d illustrate a topological arrangement in accordance with another embodiment. In this embodiment, memory system 500 is laid out in a binary tree arrangement.

Figure 7A:
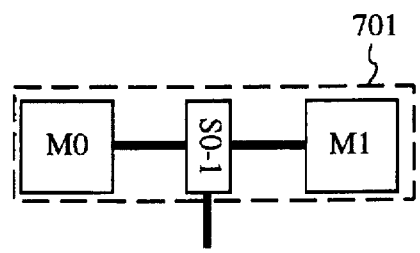
FIGS. 7a, 7b, 7c and 7d are block diagrams illustrating a memory system arranged in a binary tree configuration in accordance with another embodiment of the invention.

FIG. 7a illustrates two memory circuits M0 and M1 which are controlled by switching logic circuit S0-1. Memory circuits M0 and M1 can correspond to memory circuits 111 and 112 of memory system 100 (FIG. 1), or to memory circuits 311 and 312 of memory system 300 (FIG. 4). The input and output lines connected to memory circuits M0 and M1 and to switching logic circuit S0-1 are shown as single wire bundles for purposes of illustration. Switching logic circuit S0-1 and memory circuits M0 and M1 form a first-level hierarchical memory block 701.

Figure 7B:
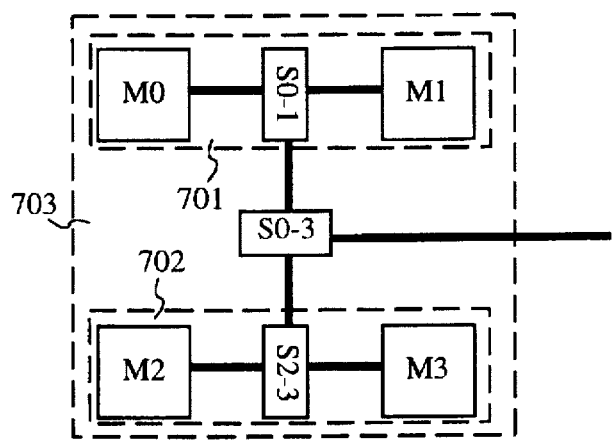

As illustrated in FIG. 7b, first-level hierarchical memory block 701 is combined with an identical first-level hierarchical memory block 702 using switching logic circuit S0-3. Memory block 702 includes memory circuits M2 and M3, which are controlled by switching logic circuit S2-3. Switching logic circuit S0-3 receives a single wire bundle which contains two sub-bundles. One sub-bundle serves hierarchical memory block 701 and the other sub-bundle serves hierarchical memory block 702. The single wire bundle received by switching logic circuit S0-3 also includes lines which carry a SPLIT_TOP_BOTTOM signal and a CONTROL_TOP_BOTTOM signal. The SPLIT_TOP_BOTTOM signal operates in the same manner as the previously described SPLIT signal to control whether first-level hierarchical memory blocks 701 and 702 are joined as a single memory or split into separate independently controlled memories. The CONTROL_TOP_BOTTOM signal operates in the same manner as the previously described CTRL_AB signal to determine which sub-bundle is used to control a joined memory. Switching control circuit S0-3 and hierarchical memory blocks 701 and 702 form a second-level hierarchical memory block 703.

Figure 7C:
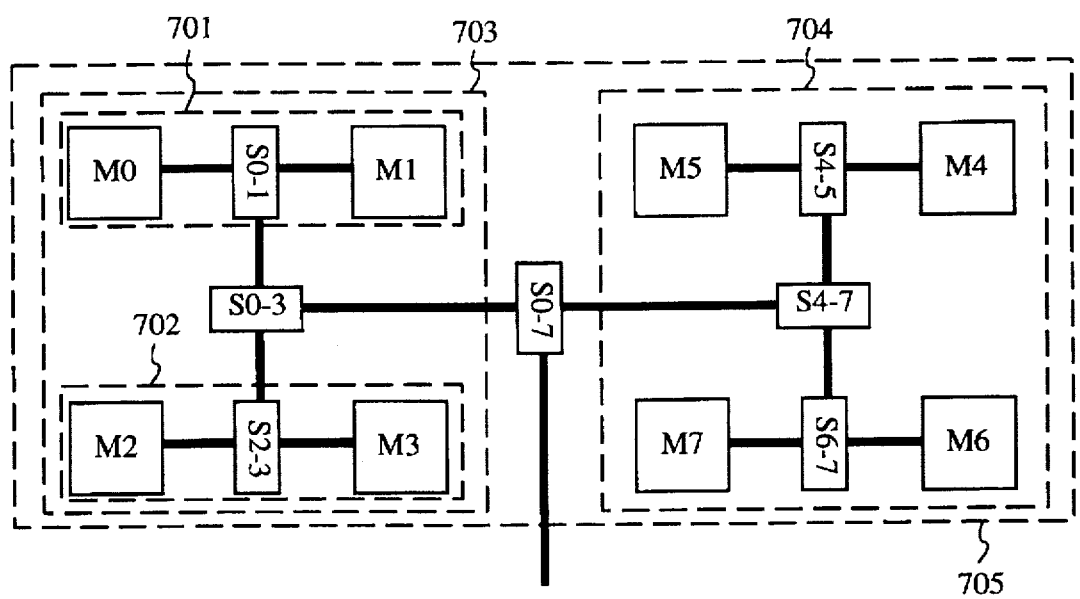

As illustrated in FIG. 7c, second-level hierarchical memory block 703 is combined with an identical second-level hierarchical memory block 704 using switching logic circuit S0-7. Second-level hierarchical memory block 704 includes memory circuits M4, M5, M6 and M7, which are controlled by switching logic circuits S4-5, S6-7 and S4-7. Switching logic circuit S0-7 operates in a manner similar to switching logic circuit S0-3. However, switching logic circuit S0-7 additionally receives a SPLIT_LEFT_RIGHT control signal and a CTRL_LEFT_RIGHT control signal. These signals allow second-level hierarchical memory blocks 703 and 704 to be operated jointly or separately as previously described. The elements illustrated in FIG. 7c form a third-level hierarchical memory block 705.

Figure 7D:
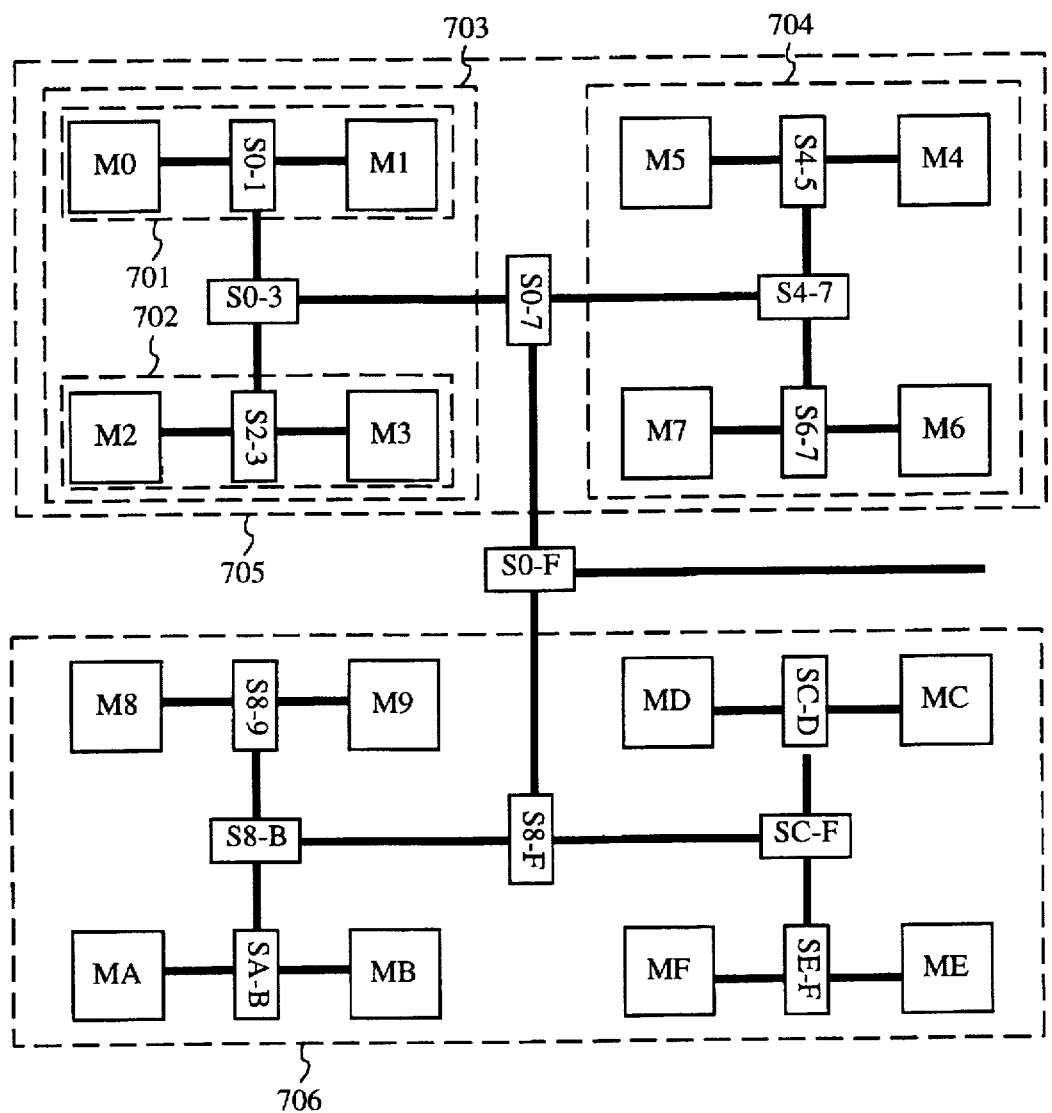

As illustrated in FIG. 7d, third-level hierarchical memory block 705 is combined with an identical third-level hierarchical memory block 706 using switching logic circuit S0-F. Third-level hierarchical memory block 706 includes memory circuits M8, M9, MA, MB, MC, MD, ME and MF, which are controlled by switching logic circuits S8-9, SA-B, S8-B, SC-D, SE-F, SC-F and S8-F. Switching logic circuit S0-F operates in substantially the same manner as the previously described switching logic circuits S0-7 and S0-3. In the foregoing manner, memory systems in accordance with the present invention can be combined in a binary tree configuration.

In different variations of the present invention, the addresses of memory system 100 can be contiguous or non-contiguous.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A memory system comprising:
   a first line set for receiving a first plurality of memory control signals;
   a second line set for receiving a second plurality of memory control signals;
   a first control line for receiving a split control signal having a first state and a second state;
   a first switching logic circuit coupled to the first line set, the second line set and the first control line;

a first memory circuit;

a second memory circuit;

a third line set coupled between the first switching logic circuit and the first memory circuit; and a fourth line set coupled between the first switching logic circuit and the second memory circuit, wherein the first switching logic couples the first line set to the third line set when the split signal is in the first state, thereby routing the first memory control signals to the first memory circuit, and couples the second line set to the fourth line set, thereby routing the second memory control signals to the second memory circuit, and wherein the first switching logic circuit couples one of the first and second line sets to the third and fourth line sets when the split signal is in the second state.

2. The memory system of claim 1, further comprising a second control line for receiving a control signal having a first state and a second state, the second control line being coupled to the first switching logic circuit, wherein when the split signal is in the second state, the first switching logic circuit couples the first line set to the third and fourth line sets when the control signal is in the first state, and the first switching logic circuit couples the second line set to the third and fourth line sets when the control signal is in the second state.

3. The memory system of claim 1, further comprising:

a second switching logic circuit coupled to receive a first output signal from the first memory circuit, a second output signal from the second memory circuit, and the split signal from the first control line, the second switching logic circuit routing the first and second output signals separately when the split signal is in the first state, the second switching logic circuit routing a selected one of the first and second output signals when the split signal is in the second state.

4. The memory system of claim 3, wherein the second switching logic circuit is further coupled to selected lines of the first and second line sets, the signals on the selected lines identifying the selected one of the first and second output signals.

5. A memory system comprising:

a first memory circuit;

a second memory circuit;

a first control line for receiving a split control signal, the split control signal having a first state and a second state;

means for accessing the first and second memory circuits in response to the split control signal, wherein the means for accessing accesses the first and second memory circuits independently when the split control signal is in the first state, and wherein the means for accessing accesses the first and second memory circuits jointly when the split control signal is in the second state.

6. The memory system of claim 5, further comprising:

a first set of lines for receiving a first set of memory control signals, the first set of lines being coupled to the means for accessing; and a second set of lines for receiving a second set of memory control signals, the second set of lines being coupled to the means for accessing, the means for accessing coupling the first set of lines to the first memory circuit and the second set of lines to the second memory circuit when the split control signal is in the first state.

7. The memory system of claim 6, wherein the means for accessing couples a selected one of the first and second sets of lines to the first and second memory circuits when the split control signal is in the second state.

8. The memory system of claim 7, further comprising a second control line for receiving a line set control signal, the line set control signal having a first state and a second state, wherein the means for accessing accesses the first and second memory circuits in response to the line set control signal, wherein the means for accessing couples the first set of lines to the first and second memory circuits when the split control signal is in the second state and the line set control signal is in the first state, and wherein the means for accessing couples the second set of lines to the first and second memory circuits when the split control signal is in the second state and the line set control signal is in the second state.

9. The memory system of claim 5, further comprising:

a first output line coupled to the first memory circuit for receiving a first output signal; and a second output line coupled to the second memory circuit for receiving a second output signal, the means for accessing routing the first and second output signals independently when the split control signal is in the first state.

10. The memory system of claim 9, wherein the means for accessing routes only one of the first and second output signals at a time when the split control signal is in the second state.

11. The memory system of claim 9, further comprising one or more additional memory circuits, wherein the means for accessing accesses the additional memory circuits in response to the split control signal.

12. The memory system of claim 11, wherein the split control signal is a 1-bit signal.

13. The memory system of claim 11, wherein the split control signal has a plurality of bits.

14. The memory system of claim 11, wherein the memory circuits are arranged in a linear manner.

15. The memory system of claim 11, wherein the memory circuits are arranged in a binary tree configuration.

16. The memory system of claim 1, wherein the split control signal changes states during operation of the memory system.

17. A method of operating a memory system comprising the steps of:

providing a plurality of memory circuits;

accessing the memory circuits independently in response to a first state of a first control signal;

accessing the memory circuits jointly in response to a second state of the first control signal.

18. The method of claim 17, further comprising the step of selecting a set of input lines for accessing the memory circuits in response to a second control signal when the first control signal is in the second state.

19. The method of claim 17, further comprising the step of selecting an output line of one of the memory circuits in response to the second control signal and selected signal on the selected set of input lines.

* * * * *